United States Patent [19]

Cote et al.

[11] Patent Number: 5,114,005
[45] Date of Patent: May 19, 1992

[54] CARTRIDGE WITH PROJECTIONS TO SECURE ARTICLES HELD WITHIN

[75] Inventors: James H. Cote; Jurgen M. Ekberg, both of Export, Pa.

[73] Assignee: National Semiconductor Corporation, Santa Clara, Calif.

[21] Appl. No.: 592,430

[22] Filed: Oct. 4, 1990

[51] Int. Cl.⁵ .............................................. B65D 73/02
[52] U.S. Cl. .................................. 206/328; 206/332; 206/334; 206/451
[58] Field of Search ............... 206/332, 329, 334, 328, 206/451, 454; 220/306

[56] References Cited

U.S. PATENT DOCUMENTS

| | | | |
|---|---|---|---|
| 3,653,498 | 4/1972 | Kisor | 206/46 H |
| 4,765,471 | 8/1988 | Murphy | 206/329 |
| 4,826,440 | 5/1989 | Plocek et al. | 439/70 |
| 4,940,156 | 7/1990 | Cote et al. | 220/22.3 |
| 5,000,697 | 3/1991 | Murphy | 439/331 |

Primary Examiner—Paul T. Sewell
Assistant Examiner—Thomas P. Hilliard

[57] ABSTRACT

The invention pertains to a cartridge for use in packaging lead frames used in the manufacture of cer-dip integrated circuits, the cartridge having a tray and a cooperative top cover capable of forming for the frames a secure transit container, yet being quickly insertable and removable to and from operating stations where frames may be fed directly into and from the container, the cartridge including wall openings to allow processing of the frames while still in the cartridge and projection for restraining the frames from movement in the cartridge.

2 Claims, 3 Drawing Sheets

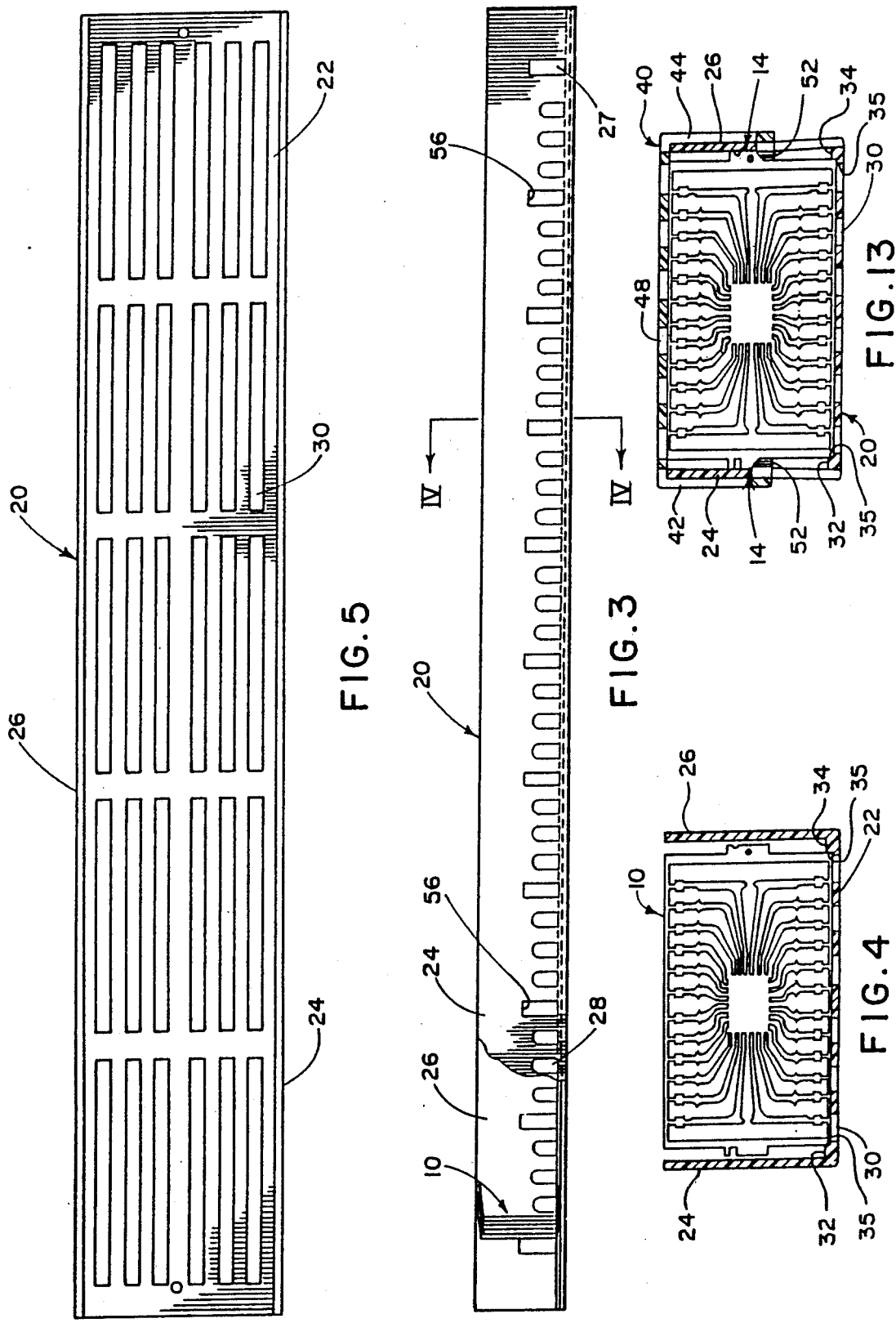

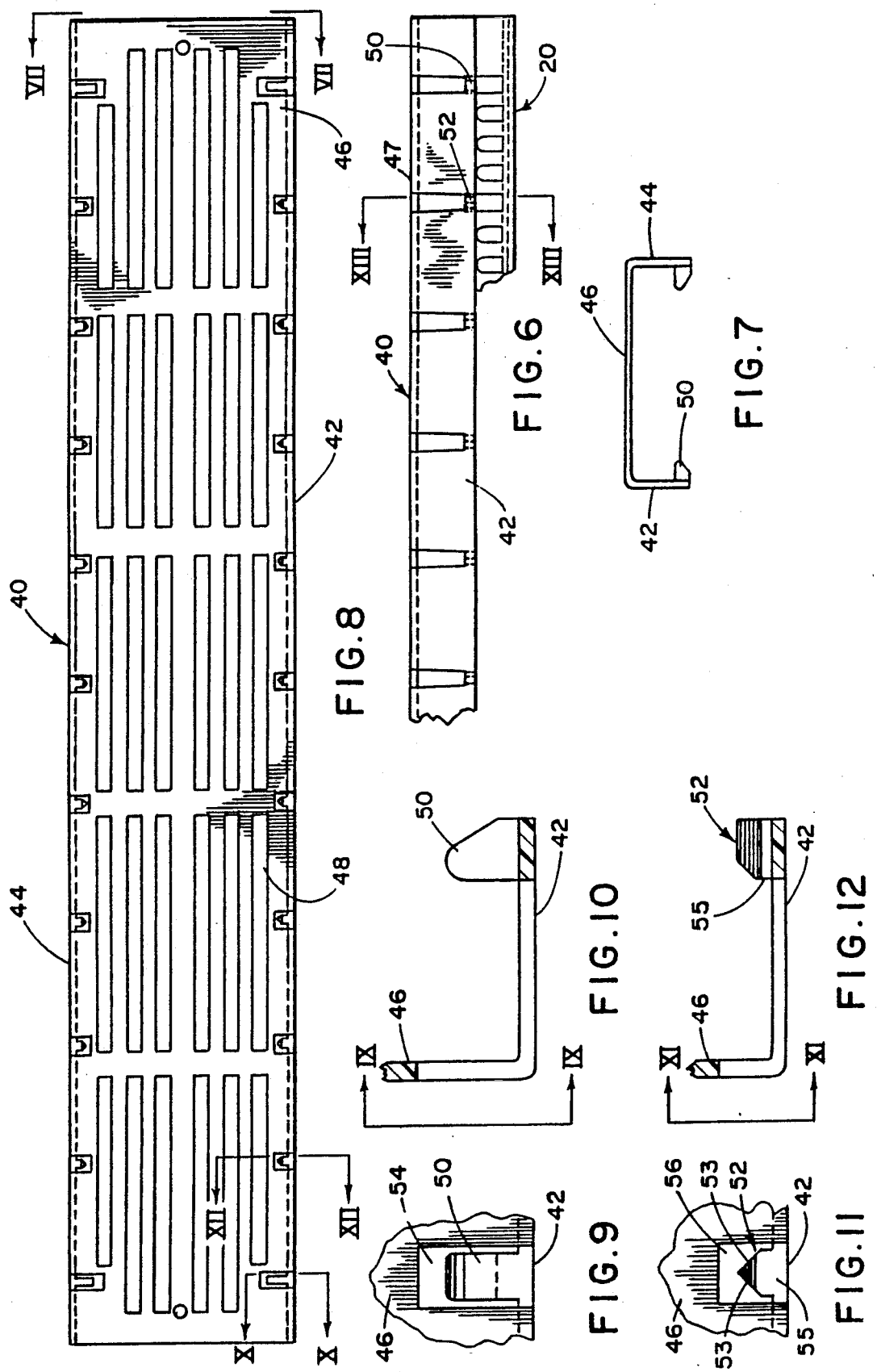

CARTRIDGE WITH PROJECTIONS TO SECURE ARTICLES HELD WITHIN

BRIEF DESCRIPTION OF INVENTION

The invention pertains to a cartridge used for handling lead frames which are employed as a component of ceramic dual in line packages, commonly referred to as cer-dips in connection with integrated circuit technology. The term "handling" as used herein, is intended to refer, for example, to the receiving of the lead frames from a stamping press, placing the frames in a secured damage avoiding packaging cartridge for transit, processing the frames while in the cartridge, and allowing the cartridge to be used to supply the lead frames to the next cer-dip assembly operation following the stamping operation, where the first step of assembly of the cer-dips take place.

BACKGROUND OF THE INVENTION

Cer-dip lead frames to which ceramic bases of chips are secured are well known in the semiconductor field and have been used in many different forms in the past in ceramic packaging technology. The lead frame are generally made from a very thin strip of aluminum/nickel/iron alloy and formed into the lead frame shape by a series of stamping operations. In the past, objections were found in the manner in which the lead frames were taken from the last stamping operation and placed by hand physically into paper boxes for transit in a plastic top-bottom container to the next cer-dip assembly operation, which could involve shipment by truck, air etc.

Because of the delicate and fragile nature of the lead frames past cartridges did not provide adequate protection from damage and/or objectionable deflection of certain portions of the frames during transit. Also when the cartridge containing the lead frames were transported to the next cer-dip assembly operation they necessitated physical removal by hand from the container and boxes in order to load the raw lead frames into magazines for the next cer-dip assembly operation.

OBJECTS OF THE PRESENT INVENTION

It is an object of the present invention to provide a cartridge for cer-dip lead frames and the like which will allow, among other advantages, the quick and efficient loading and unloading of the frames directly to and from the cartridge, damage protective shipment of the frames, and permit the frames to be processed while still carried in the cartridge.

Another object of the invention is to provide a cartridge for use in packaging lead frames used in the manufacture of cer-dip integrated circuits, the cartridge having a cooperative bottom tray and top cover capable of forming for the frames a secure transit container, yet being quickly insertable and removable to and from operating stations where the frames may be fed directly into and from the container, the cartridge including wall openings to allow processing of the frames while still in the cartridge, and projections for restraining the lead frames from movement in the cartridge.

A still further object of the invention is to provide, in the immediately above referenced cartridge, openings in the bottom tray and top cover to allow for processing of the lead frames while still in the cartridge, such as for example a degreasing operation wherein the openings allow for adequate drainage of the degreasing medium.

Another object of the invention is to provide for the above referred to cartridge to have lead frame restraining members to prevent relative movement between the frames and the cartridge and to prevent the frames from falling out of the open ended cartridge once loaded, and wherein the cartridge has a plurality of surfaces for securely containing the frames during movement of the cartridge, such as in transit, in a manner to eliminate movement of the frames in the cartridge and to minimize deflection of certain critical portions of the frames.

BRIEF DESCRIPTION OF THE DRAWINGS

These objects, as well as other novel and important features of the present invention will be better understood when the following description is read along with the accompanying drawings of which:

FIG. 3 is an elevational view of the bottom tray of a cartridge built in accordance with the present invention, FIG. 4 is an end view of the tray shown in FIG. 3, showing a single lead frame in the tray, FIG. 5 is a top view of the tray shown in FIGS. 3 and 4, FIG. 6 is an elevational view of the top cover of a cartridge built in accordance with the present invention, FIG. 7 is an end view of the top cover shown in FIG. 6, FIG. 8 is a top view of the top cover shown in FIGS. 6 and 7, FIG. 9 is a sectional view taken on line 9—9 of FIG. 8, FIG. 10 is a sectional view taken on line 10—10 of FIG. 9, FIG. 11 is a sectional view taken on line 11—11 of FIG. 8, FIG. 12 is a sectional view taken on line 12—12 of FIG. 11, and FIG. 13 is a view similar to FIG. 4 but with a cover placed over the tray to form a cartridge.

DETAILED DESCRIPTION OF PREFERRED EMBODIMENT OF THE INVENTION

Figure 1:
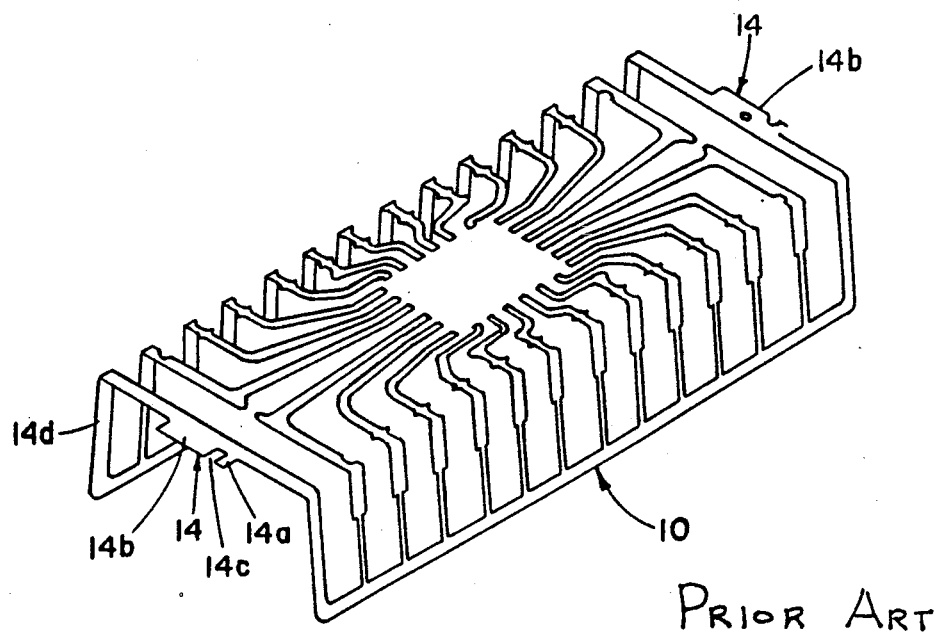
FIG. 1 is an isometric view of one form of a cer-dip lead frame.
Figure 2:
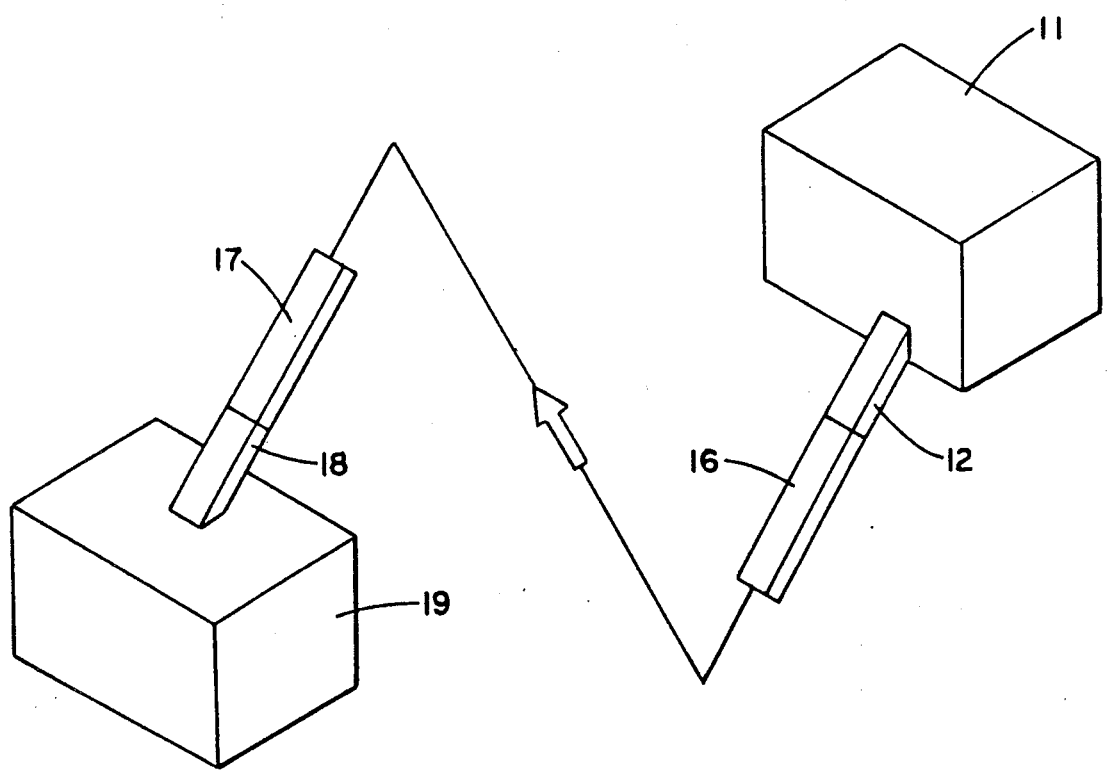
FIG. 2 is a combined isometric view and block diagram of a stamping press station with its exit chute shown with a first cartridge positioned to receive lead frames from the press and the next cer-dip assembly operating station with its entry chute having a second cartridge arranged adjacent the chute thereof.

With reference to FIGS. 1 and 2, there is illustrated one form of one of a number of lead frames 10, which is produced in accordance with a well known practice by a series of stamping presses, the last press in the series being indicated in block form at 11, where there is also shown the outline of a well known exit chute 12 for the press. The lead frames 10, of a well known type and shape will have a uniform thickness generally between 0.0095" to 0.0105", being in the illustrated form "U" shaped and having end tabs 14 extending outwardly from their "top" side. Each tab 14 has an upper short portion 14a separated from a lower longer portion 14b by cut outs 14c, although not necessarily identical in shape. The frames exit from the press 11 into the chute 12 on one of their common legs, with their openings facing away from the press and with the lower longer portions 14b of the tabs 14 in the lower position so that the frames fit into each other to form a generally solid pack of frames, which pack will be received by and fill up a cartridge 16, built in accordance with the teaching of the present invention.

The downwardly inclined chute 12 is provided to permit each individual lead frame to slide down and away from the press, where they are received by the cartridge 16, as assisted by a workman (its cover removed). FIG. 2 also illustrates a second cartridge 17 arranged at the entry end of the next cer-dip assembly operating station remote from the last press station. The second cartridge (its cover removed) is positioned to cooperate with a second downwardly inclined chute 18 into which the lead frames are fed and slide downwardly for loading assembly magazines, not shown, with raw lead frames of the next cer-dip assembly operation, indicated generally in block form at 19.

The particular characteristics of the cartridges 16 and 17 are best shown in FIGS. 3 thru 13, in which reference will first be made to FIGS. 3–5, which pertain to the bottom tray 20 of the cartridges. Since the cartridges are identical, only the cartridge 16 will be described, which is made of injection molded copolymer polypropylene of the type capable of withstanding at least one hour exposure to vaporized freon or other presently used degreasing mediums.

As shown in FIG. 4, the tray has a bottom 22 and two upright sides 24 and 26 and takes the form of a "U" shaped tube. FIG. 3 shows that along the entire length of the side 24 it is provided with two series of openings 27 and 28, the openings 27, being provided as holding projections, are somewhat larger in the vertical direction than the openings 28, the openings of which also have rounded upper portions and are provided for drainage. The side 26 has the same series of openings, which are arranged to correspond lengthwise with similar openings of the side 24. FIG. 5 illustrates that the bottom 22 of the tray has five series of identical openings 30 that extend generally over its entire width and length and which allow for drainage during degreasing.

In referring once again to FIG. 4, in the area where the sides 24 and 26 join with the bottom 22 longitudinal flat surfaces 32 and 34 are formed having a sufficient transverse depth and vertical height to form effective inner opposed vertical guiding surfaces 35 for the end portions 14d (see FIG. 1) of each lead frame, one of which is indicated in FIG. 4. The tabs at the ends of each frame project outwardly from the outer portions of the sides of the frames a distance, in the example being described, of approximately 0.050", which is generally equal to the depth of the surfaces 32 and 34.

As indicated in FIG. 4, during the loading of the tray 20 there exist a clearance between the opposite edges of the tabs 14 and the inner walls of the tray, which clearance is taken up when the cover is placed on the tray as can be seen in comparing FIG. 4 with FIG. 13. FIG. 4 also shows that the frames extend slightly above the top edges of the sides 24 and 26.

Turning now to FIGS. 6 thru 13, which relate to the top cover 40, as in the case of the tray 20 the cover is made of the same thickness and material, and takes the form of an inverted "U", dimensioned to fit snugly over the tray to create a relatively thin, light weight, longitudinal plastic tube. The cover in the illustrated example has, in approximate terms, a length of 11", a height of ¾", a width of 1 ⅛" and a wall thickness of 1/32". As shown in FIG. 7, the "bottom" of the cover is the "open" side formed by two "material" sides 42 and 44 and a top 46. FIG. 6 indicates that along the entire length of the sides 42 and 44 drainage openings 47 are provided. FIG. 8 shows that the top 46 is provided with five series of openings 48, similar to the openings 30 of the tray 20, which are also used to allow drainage during degreasing.

With reference to the sides 42 and 44, they are provided at their opposite ends with opposed end projections 50, FIG. 10 showing an enlargement thereof. FIG. 8 indicates that the end projections 50 extend toward the interior of the top cover 40 a distance sufficient to prevent a pack of lead frames from falling out of the opposite open ends of the cartridge once the top cover 40 is placed over the tray 20 and the projections pass into the openings 27 of the tray. As FIG. 7 indicates, the projections 50 are located at the very bottom of the sides 42 and 44 of the cover, in which the upper surfaces of the projections 50 are dimensioned to fit tightly against i.e. snap into the adjacent surfaces of the openings 27 of the tray 20.

When the cover 40 is placed over the tray 20, as shown in FIG. 13, the sides 24 and 26 of the tray are urged toward each other to take up the clearance between the end tabs 14 and the interior walls of the sides 24 and 26. In this way, the opposite ends of the frames are held securely from moving in the direction of the sides. At the same time, the bottom 22 of the tray 20 and the top 46 of the cover 40 snugly engage the opposite adjacent sides of the frames. Thus, the lead frame pack is tightly contained within the cartridge, so that each frame is held from both deflecting and movement relative to the cartridge, no matter what disposition or position in which the cartridge may be arranged, i.e. horizontally, vertically or on its sides.

The sides 42 and 44 of the cover also are provided with a series of evenly spaced projections 52, arranged between the end projections 50, shown best in FIGS. 11 and 12. As in the case of the end projections 50, the projections 52 project toward the interior of the cover, howbeit not as far and are also located at the bottom of the sides 42 and 44. The projections 52 also pass through the openings 27 of the tray 20, there being an opening 27 for each projection 52, these openings being best shown in FIG. 3. As seen in FIGS. 11, the inner ends of the projections 52 are tapered at 53 and have flat surfaces 55, in which the upper surfaces of the projections 52 are dimensioned to fit tightly against, i.e. snap into, the adjacent upper surfaces of the openings 27 of the tray 20, the upper surfaces being contacted by the flat surfaces 55.

The end projections 50 are made long enough to sufficiently overlap portions of the two end frames of the pack to maintain the pack in the open ended cartridge once the cover is placed over the tray 20. The length of the pack is kept short enough to allow the projections to pass unrestrictively through the openings 27 of the tray. As to the projections 52, when the cover is placed over the tray the tapered ends 53 of the projections will gently force themselves between adjacent lead frames and contact the portions 14b of the end tabs 14 to divide the frames into several predetermined sized groups and hold the groups from moving longitudinally relative to the cartridge during transit thereof.

By dividing the pack into generally equal numbers of frames, the lower most frames are not subject to the weight of the stack of upper frames when the cartridge is placed in a vertical position. Instead each formed group, including the group between the lowest most pair of projections 52 and the lowest most pair of projections 50, will carry the weight of only their respective groups. In this way objectionable deflection and/or distortion of the lower most frames of each group is minimized. Depending on the collective weight of the frames that make-up a group of frames, the projections can be arranged as a function of such weight in different cartridges.

The top 46 of the cover 40, in each location where there are projections 50 and 52, is provided with side openings 54 and 56, respectively, as best seen in FIGS. 9 and 11, which permit additional drainage open areas for the degreasing operation. These openings are in the same planes as the openings 47 in the sides 42 and 44 of the cover. The cover 40 is dimensioned relative to the tray 20, so that the inside walls of sides 42 and 44 of the cover tightly contact the outside walls 24 and 26 of the tray, as shown in FIG. 13.

One example of the use of the cartridges may be explained as follows: As shown in FIG. 4 the tray 20 of the cartridge 16 with its top cover 40 removed is arranged at the end of the chute 12 of the press 11. As each lead frame 10 exits from the press with its "open" side facing away from the paper in FIG. 4, they telescope into each other until the entire cartridge is filled with a closely nested pack, as may be assisted by the workman, and with the tabs 14 of all frames guided by the vertical surfaces 35 of the tray 20.

The top cover 40 can be then placed over the tray 20 and the integral cartridge removed from the chute 12. Once the cover is placed over the tray the projections 50 and 52 will restrain the frames, as noted above, to prevent the frames from falling out of the open ended cartridge and to minimize damage during transit. The supported and tightly contained frames now can be degreased without removing them from the cartridge or removing the top cover 40, in which the openings in the tray and cover will allow drainage of the degreasing medium.

Also during transit, no concern need be exercised as to maintaining the cartridge in any "shipping position", to minimize objectionable deflection of critical portions of the lead frames since they will be tightly contained against defection and movement. When the cartridge arrives at the next cer-dip assembly operation and the top cover 40 is removed, allowing the creation of the clearances between the sides 24 and 26 of the tray and the tabs 14 of the frames 10, the frames can be fed directly from the tray 20 into a assembly magazine with raw lead frames arranged, for example, at the chute 18 of the station 19.

While the invention has been described in the preferred embodiment, it will be appreciated by those skilled in the art that the cartridge may take other forms, be used for other purposes and for other types of lead frames or like objects than what is herein described without departing from the invention.

We claim:

1. An elongated container for receiving a number of individual articles, comprising:
    a tray having a generally uniform elongated article receiving area,
    said tray formed by generally parallel elongated spaced apart sides joined by a coextensively extending elongated bottom,
    a cover formed by generally parallel elongated spaced apart sides joined by a coextensively extending elongated top,
    said tray and cover being dimensioned so that said tray and cover tightly fit together to form an integral container,
    said tray having a series of spaced apart openings in its said sides formed to pass uniformly through said sides of said tray,
    said cover having a series of spaced apart projections in its said sides arranged to cooperate with said openings in said sides of said tray, said projections having portions to engage and restrain the articles from movement relative to said tray and cover,
    the articles having projecting tabs at their opposite ends,
    said tabs having side portions, and
    said projections of said cover having ends constructed to fit between and support adjacent side portions of said tabs.

2. An elongated container for receiving a number of individual articles, comprising:
    a tray having a generally uniform elongated article receiving area,
    said tray formed by generally parallel elongated spaced apart sides joined by a coextensively extending elongated bottom,
    a cover formed by generally parallel elongated spaced apart sides joined by a coextensively extending elongated top,
    said tray and cover being dimensioned so that said tray and cover tightly fit together to form an integral container,
    said tray having a series of spaced apart openings in its said sides formed to pass uniformly through said sides of said tray,
    said cover having a series of spaced apart projections in its said sides arranged to cooperate with said openings in said sides of said tray, said projections having portions to engage and restrain the articles from movement relative to said tray and cover,
    said projections including a plurality of first end projections and a plurality of second projections arranged between said first end projections; and
    said second projections are constructed to extend through cooperative openings in said tray into the interior of the container at selected points along the said sides of said tray to divide the articles in the container into groups.

* * * * *